United States Patent [19]

English et al.

[11] Patent Number: 5,457,430
[45] Date of Patent: Oct. 10, 1995

[54] METHOD AND APPARATUS FOR REDUCTION OF LIGHT INTENSITY DECAY IN OPTICAL PUMPING DEVICES

[75] Inventors: Thomas C. English, Costa Mesa; Funming Li, Irvine; Ronald E. White; James A. Carmichael, both of Lake Forest, all of Calif.

[73] Assignee: Ball Corporation, Muncie, Ind.

[21] Appl. No.: 337,287

[22] Filed: Nov. 10, 1994

[51] Int. Cl.⁶ ................................ H01S 1/06; H03L 7/26
[52] U.S. Cl. .............................................. 331/94.1; 331/3
[58] Field of Search ........................................ 331/3, 94.1

[56] References Cited

U.S. PATENT DOCUMENTS

| | | | |
|---|---|---|---|
| 4,405,905 | 9/1983 | Busca et al. | 331/94.1 |
| 4,661,782 | 4/1987 | Weidemann | 331/3 |
| 4,953,148 | 8/1990 | Lepek et al. | 368/202 |

OTHER PUBLICATIONS

*Influence of Modulation Frequency in Rubidium Cell Frequency Standards* by C. Audoin, J. Viennet, N. Cyr and J. Vanier Undated Paper, pp. 87–111.

"Tarnishing of Silver by Sulfur Vapor: Film Characteristics and Humidity Effects" by B. T. Reagor and J. D. Sinclair, *Solid–State Science and Technology*, Mar. 1981. pp. 701–705.

"Formation and Growth of Tarnish on Evaporated Silver Films" by H. E. Bennett, R. L. Peck, D. K. Burge and J. M. Bennett, *Journal of Applied Physics*, Jul. 1969. pp. 3351–3360.

"Tarnishing of Silver by Organic Sulfur Vapors: Rates and Film Characteristics" by J. D. Sinclair, *Electrochemical Science and Technology*, Jan. 1982. pp. 33–40.

"Optical Constants of Silver Sulfide Tarnish Films" by J. M. Bennett, J. L. Stanford and E. J. Ashley, *Journal of the Optical Society of America*, Feb. 1970. pp. 224–232.

"Subminiature Subidium Oscillator Model FRS" Description and Operation Manual, Chapter 3, by Ball Efratom Division, 1989.

EG&G Model RFS–10 Atomic Rubidium Frequency Standard photographs, 10 pages by Ball Efratom Division.

NEC Neatomic Rb–3200 Rubidium Frequency Standard photographs, 5 pages by Ball Efratom Division.

*Primary Examiner*—David Mis
*Attorney, Agent, or Firm*—Willian Brinks Hofer Gilson & Lione

[57] ABSTRACT

Optical pumping devices use light reflected from reflecting surfaces to provide a portion of the light incident on the photodetector. Conventional optical pumping devices experience a decay, over time, of the initial light intensity incident on the photodetector. The optical pumping device of the invention experiences reduced light intensity decay. The invention passivates the reflecting surfaces to eliminate tarnish and oxidation by pretarnishing the surfaces or covering the surfaces with a material whose reflectivity does not vary over time, such as gold.

39 Claims, 2 Drawing Sheets

METHOD AND APPARATUS FOR REDUCTION OF LIGHT INTENSITY DECAY IN OPTICAL PUMPING DEVICES

FIELD OF THE INVENTION

The present invention relates to optical pumping devices, such as atomic frequency standards, magnetometers and the like, and particularly to atomic frequency standards that generate and use light for optical pumping and/or detection of atomic transition. More particularly, the invention relates to methods and apparatus for reducing the decay of light intensity occurring over time with such apparatus.

BACKGROUND OF THE INVENTION

In certain types of atomic frequency standards and magnetometers, light is generated and used, for example, for optical pumping and for detecting an atomic (e.g., clock) transition. In such atomic frequency standards and magnetometers, the stability of the light intensity over long periods of time (many years) is desired in order to maintain the integrity of the standard or magnetometer.

An atomic frequency standard is a device that uses an atomic transition frequency derived from an atomic or molecular species experiencing a transition between two or more well-defined energy levels of the atom or molecule to control a standard frequency oscillator.

For example, the two lowest energy levels of the rubidium atom (Rb) are known as the ground state hyperfine energy levels A and B. When atoms of gaseous Rb-87 are interrogated (irradiated) with microwave energy at a precise "transition frequency", corresponding to the rubidium frequency that causes atom transitions between the hyperfine energy levels A and B, the rubidium atoms at hyperfine energy level A will make the transition to level B, and vice versa. The transition is employed as a highly accurate frequency reference to which the frequency of a quartz crystal oscillator or voltage-controlled crystal oscillator (VCXO) can be electronically locked in creating an atomic frequency standard.

For example, in atomic frequency standards the frequency of a controllable frequency source, such as a quartz crystal oscillator, is controlled by means of a physics package and associated electronics that are devoted to maintaining the assigned output frequency, typically 5 MHz or 10 MHz, on a very long-term, exceedingly accurate and stable basis. By properly slaving the quartz crystal oscillator to the frequency of the atomic transition in the physics package, the tendency of the quartz crystal to exhibit drifting due to aging and other inherent as well as environmental effects is markedly suppressed. The physics package of a typical, passive, gas-cell, atomic frequency standard generally includes a microwave cavity resonator, an isotopic filter cell, an absorption cell, a light source, a photodetector, temperature control means, at least one magnetic shield surrounding these components, and a C-field coil.

In a typical rubidium atomic frequency standard, the light source 11 is a glass bulb containing rubidium atoms which produces light by an rf-excited plasma discharge. The rubidium in the lamp is heated to a vapor state, approximately 110° C., and is subjected to a high-energy rf field from an exciter coil surrounding the glass bulb, thereby generating light from the excited rubidium atoms. As shown diagrammatically in FIG. 1, the "rubidium light" is directed through a filter cell 25a which contains an isotope of rubidium, such as Rb-85, which filters out light with a wavelength that will stimulate transition of atoms from the hyperfine energy level B to any optically-excited level C. The filtered rubidium light is then directed through an absorption cell 25, also called a resonance cell. The absorption cell 25 includes another isotope of rubidium, Rb-87, and the filtered light energy absorbed by the Rb-87 atoms at hyperfine energy level A causes a transition of the Rb-87 atoms from level A to any optically-excited energy level C. The atoms excited to energy level C, however, do not remain at level C for more than tens of nanoseconds, but return to ground state hyperfine levels A and B in approximately equal numbers by either spontaneous emission of light and/or by collisions, including collisions with other atoms, molecules, or the walls of the absorption cell 25. Since the filtered light does not allow transitions of atoms from level B to level C, the continuing cycle of optical excitation of atoms from level A to level C and the redistribution of atoms falling from level C between levels A and B eventually results in few, if any, atoms at level A for excitation to level C, and little or no absorption of the light passing through the absorption cell 25 because the atoms have accumulated at hyperfine energy level B. The atoms at level A are said to have been "optically pumped" to level B. If, however, microwave energy is applied to the absorption cell 25 at the rubidium transition frequency, transitions of atoms between hyperfine levels A and B occur, re-introducing atoms at level A which again absorb light energy and undergo a subsequent transition to level C and thereby reduce the light passing through the absorption cell 25.

The rubidium light passing through the absorption cell 25 is incident on a photodetector 16, which produces a current output which is proportional to the intensity of the incident light. In a frequency-locked loop, current output is processed by servo electronics to provide a control voltage to a voltage controlled crystal oscillator (VCXO) whose output is multiplied (and synthesized) to the rubidium transition frequency and provides the microwave energy used to cause the transitions between hyperfine levels A and B. When the frequency of the microwave energy corresponds to the hyperfine transition frequency, about 6.834 GHz for Rb-87, maximum light absorption occurs and the current output of the photodetector 16 is reduced. If, however, the frequency of the microwave energy does not correspond to the hyperfine frequency, then more light will pass through the absorption cell 25 to the photodetector 16, which in turn increases its current output. Thus, the photodetector current output can be used to provide an error signal to maintain the output frequency of the VCXO, typically 5 or 10 MHz, (which, as noted above, is multiplied and synthesized to produce the hyperfine transition frequency of the rubidium atoms), thereby creating an extremely stable 5 or 10 MHz output frequency standard.

For years, the inventors have known that the intensity of the light reaching the photodetector decays slowly over time, and thereby degrades the performance of the frequency standard. For example, as previously discussed, in a typical frequency standard, the light is eventually detected by a photodetector, which produces a photocurrent that is proportional to the intensity of the incident light. Since an ac detection scheme is used in these devices, the signal information appears as a very small modulated (ac) component (fundamental) of the total photocurrent which has the property that it is zero when the dc photocurrent is a minimum. The modulated photocurrent is processed electronically by a frequency-locked loop to produce an error signal which is used to steer the VCXO, keeping it on frequency: when the VCXO is on frequency the light reaching the photodetector is a minimum and in this case the ac component (fundamental) of the photocurrent disappears so that there is no error signal. If the VCXO frequency drifts, then the photocurrent is no longer a minimum and an ac signal and associated error signal results.

For example, if the VCXO frequency drifts away from the nominal stabilized value by a certain amount, this will produce an ac signal. The larger this signal is, the larger the frequency-locked loop gain and the better the loop can lock the VCXO frequency to the hyperfine frequency. Generally, the greater the intensity of the rubidium light, the larger is this ac signal. Thus, it is advantageous to have high light intensity. Since the photocurrent is electronically converted to a proportional voltage (the "light voltage"), a high light voltage is likewise advantageous; any decrease in the light voltage (corresponding to a decrease in light intensity) tends to reduce the gain of the frequency-locked loop and worsens the standard's frequency stability.

The intensity of the light that excites the absorption cell is also an important factor in determining the sensitivity and frequency discrimination function of the physics package. As the intensity of light at the photodetector decays, the number of atoms undergoing transition as a result of interrogation decreases with time, the light voltage from the photodetector decays, the gain of the frequency-locked loop decreases, and the performance of the frequency standard degrades. As the loop gain of the frequency-locked loop decreases further, offsets will begin to appear and the short-term frequency stability begins to worsen. Light voltage decay can also produce frequency shifts of the standard's output frequency due to the light shift effect that maps light intensity changes into frequency changes, resulting in frequency aging.

Some rubidium frequency standards are designed to increase their internal supply voltage to a high value prior to lamp ignition (this facilitates lamp ignition). After lamp ignition the supply voltage is reduced to its normal operating value by an electronic switch that is activated by the light voltage. If, for some reason, the light voltage falls below the value at which switching occurs (threshold value), the supply voltage will return to the higher value. Should the light voltage decay during normal operation so that it falls below the threshold value, the supply voltage will suddenly switch to the higher value and remain there. This will produce a major change in the unit's output frequency and render it unsuitable for its intended purpose.

Even a small decay rate in the light intensity can be a problem if it continues over a long period of time. For example, a theoretical exponential decay at a rate of 1 percent per month will cause the light voltage to decay to 50 percent of its initial value over a period of approximately six years, and a decay rate of 0.6 percent per month will cause the light voltage to decay to 50 percent of its initial value over a period of about 10 years.

The inventors have known and studied the problem of light intensity decay for years. The rate of light decay and the lower light intensity that is ultimately reached has been found to vary widely and unpredictably from apparatus to apparatus. Testing has indicated that in some groups of atomic frequency standards as little as 6 to 10 percent of the initial light intensity will ultimately be lost and in other groups of atomic frequency standards as much as 40 to 50 percent of the initial light intensity will ultimately be lost. Testing has also indicated that the rate of loss varies from group to group, with the time constant of an equivalent exponential decay being as low as 1 to 2 months with some groups and as high as 3 to 6 months in others. Many possible causes of the light decay were considered and investigated, but the primary cause of the light decay remained unknown until recently. Thus, this unpredictable loss of light intensity has continued to degrade the performance for many atomic frequency standards, and a method and apparatus that can reduce light intensity decay is needed to obtain predictable aging and substantially improve the performance of optical pumping devices, such as atomic frequency standards, magnetometers and the like.

SUMMARY OF THE INVENTION

The inventors have now discovered that the time decay of light intensity is due primarily to the decreasing reflectivity of reflecting surfaces within the physics package. In a frequency standard, the light, once generated, reflects off internal surfaces of the physics package, and such reflected light is a significant percentage of the total useful light reaching the absorption cell. The exciter coil surrounding the glass bulb is advantageously made of silver, which is selected as much for its reflectivity as for its electrical conductivity. Other surfaces, such as the interior surfaces of a resonance cavity surrounding the absorption cell, are silver plated to provide additional reflected light. The inventors have discovered that the tarnishing and oxidation over time of the useful light reflecting surfaces is the principal cause of the time decay of light intensity and that by passivating the light reflecting surfaces of the device, especially the surfaces of the exciter coil, light intensity decay problems can be substantially eliminated. Such tarnishing may be the result of, or accelerated by, the outgassing of physics package materials.

According to the present invention, surfaces that reflect optical pumping light are passivated so their light reflectivity does not change over time. Such reflecting surfaces can be "passivated" in various ways. In embodiments of the invention, the passivating step can include the step of providing the surfaces with a non-reflective layer, or the step of providing the surfaces with a layer whose reflectivity remains substantially constant over time, or the step of altering the surfaces so their reflectivity does not change over time. Examples of passivation include forming a stable light reflective layer on such surfaces by gold plating, sulfides, oxides and the like. Thus, a method for reducing light intensity decay in an atomic frequency standard that uses an ensemble of atoms that are optically pumped and interrogated by a microwave signal so as to produce a photocurrent which is used to control the frequency of the microwave signal, includes the steps of: providing a plasma discharge lamp for optically pumping the ensemble of atoms, and providing surfaces, or passivating the surfaces, that reflect light from the lamp toward the ensemble of atoms so their light reflectivity does not change over time.

In a frequency standard that includes a light source, an absorption cell, a photodetector for detecting the light from the light source, and an exciter coil positioned to excite the light source to stimulate emission of the light, and including a surface to reflect a portion of the light toward the absorption cell and photodetector, the reflective surface of the exciter coil is passivated to reduce decay of the light intensity, over time, of the light available at the photodetector. Where the light source comprises a lamp assembly including a light reflective surface, the reflective surface of the lamp assembly is passivated. In one embodiment of the invention, the passivated light reflective surface comprises gold. In another embodiment, the exciter coil surrounds the lamp and the lamp's passivated surface comprises gold.

By providing passivated reflective surfaces whose reflectivity does not change with time, the present invention substantially reduces the unwanted effects associated with the light intensity decay over time.

Additional objects, features, and advantages of the invention will become apparent to those skilled in the art upon consideration of the following detailed description of a preferred embodiment exemplifying the best mode of carrying out the invention as presently perceived.

DETAILED DESCRIPTION OF THE DRAWINGS

Figure 1:
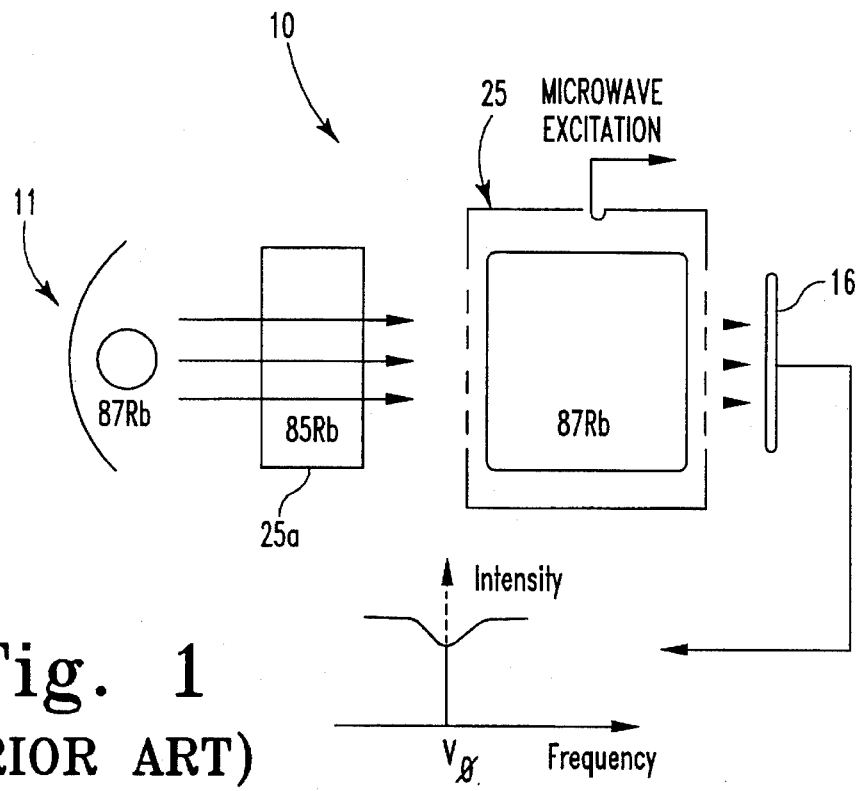
FIG. 1 is a diagrammatic representation of an optical physics package.
Figure 2:
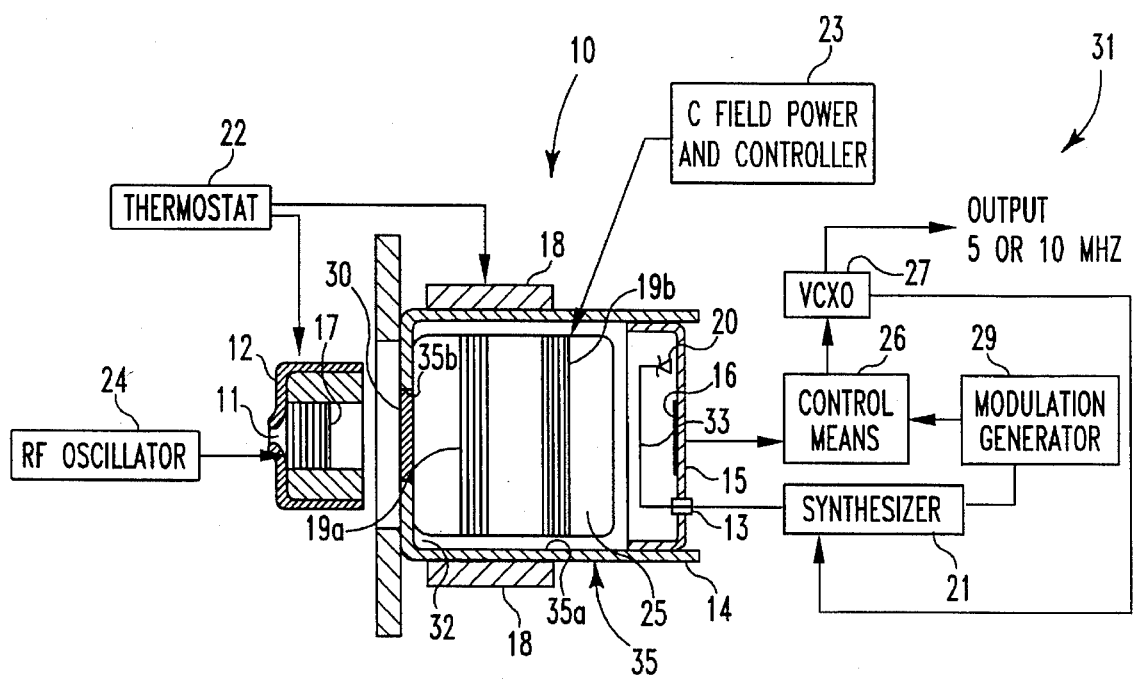
FIG. 2 is a side sectional view of the optical physics package along with the associated electrical components shown schematically.

The exemplary embodiment of the optical-physics package 10 illustrated in FIG. 2, is directed to an embodiment using one of the alkali metals, viz., rubidium. The embodiment includes an electrode-less gas discharge lamp 11, which is evacuated and filled with rubidium, plus a suitable buffer gas at a pressure, generally about 2 torr (0.27 kPa), surrounded by an exciter coil 17. In conventional, commercial atomic frequency standards of the type most commonly used, the exciter coil 17 is typically formed by separated turns of uncoated silver wire. The coil 17 is activated by a radio-frequency oscillator 24. The lamp 11 within a lamp housing 12 of the optical-physics package 10 is arranged with a thermostat 22 which renders a controllable temperature, usually about 110° C., which is required for generating the requisite rubidium vapor pressure in the lamp 11. As can be appreciated, the thermostat 22 keeps the temperature of the liquid rubidium metal constant within narrow limits, as the light emitted by the lamp 11 is dependent on variations in the rubidium vapor pressure and, hence, on this temperature.

The light radiated from the lamp 11 and reflected from exciter coil 17 and other small surfaces arrives at a photodetector 16 after transversing an absorption cell 25 positioned between lamp 11 and photodetector 16. The light reaching the photodetector is a combination of direct path light from the lamp 11 and light reflected from light reflective surfaces of the exciter coil 17, the lamp housing 12, and microwave resonant cavity 35. The absorption cell 25 comprises an evacuated cylindrical glass bulb which is likewise filled with vaporized rubidium having a suitable vapor pressure and with a buffer gas, such as nitrogen or argon, or some mixture of such buffer gases.

In the particular embodiment of the optical-physics package 10 shown in FIG. 2, it should be observed that no separate filter cell is employed as is often conventional in such devices, but instead an absorption cell 25 of special design as that described in U.S. Pat. No. 3,903,481 to Ernest Jechart is contemplated. Thus, the absorption cell 25 is one containing an isotopic mixture and, more particularly, a mixture of Rb85 and Rb87 atoms in accordance with the teaching of said patent to Jechart.

When the Rb87 in the lamp 11 is excited it emits light having a spectrum containing the two strong optical lines of Rb87 ($D_1$ at 794.8 nm and $D_2$ at 780.0 nm) each of which, in turn, contains two main hyperfine components. A beam of such light transversing the absorption cell 25 containing the buffer gas as well as the mixture of Rb85 and Rb87 isotopes causes the preferential absorption of one of the hyperfine components for both $D_1$ and $D_2$ lines. The remaining $D_1$ and $D_2$ spectral component serves as optical pumping light and brings about a population inversion between the two ground state hyperfine levels of Rb87 in the absorption cell 25. Preferentially, only those atoms that are in the lower hyperfine state absorb the optical pumping light and are raised into optically-excited high-energy states.

Furthermore, by spontaneous emission or collision, such atoms return to one of the ground hyperfine states. Because the number of atoms able to absorb the optical pumping light decreases, the absorption cell 25 tends to become transparent. Upon introduction of microwave radiation into the microwave cavity 35, resonant at a frequency of 6.834 . . . GHz corresponding to the energy gap between the two ground state hyperfine levels, the population increase of atoms in the lower hyperfine level increases. The increase in population provides more atoms for the absorption of light from the light source. The atoms that arrive in this lower state are, of course, optically pumped and raised to higher energy states. As the atoms drop into the lower ground state hyperfine level from the upper ground state hyperfine levels, a correspondingly smaller amount of light reaches the photodetector 16 since light is being actively absorbed by Rb87. When there is less light reaching the photodetector 16 there is a corresponding reduction in the photocurrent produced by the photodetector 16. This decreasing light signal, as the microwave frequency approaches the very-sharply-defined rubidium frequency, is converted electronically to an error signal with amplitude and phase information that is used to steer the VCXO 27 via its control voltage to keep it at a standard frequency of e.g., 10 MHz. When the microwave frequency is equal to the rubidium transition frequency, VCXO 27 is frequency locked to the stable atomic transition frequency. Thus, by use of the above described scheme the VCXO 27 can be exactly 10 MHz when the microwave frequency is exactly equal to the frequency of the rubidium transition.

It is to be noted that the photodetector 16 and absorption cell 25 are fully enclosed within the microwave cavity resonator 35 which is of cylindrical design and includes a cylindrical body 14 having a light-permeable dielectric window 30 therein and a lid 15 integrally connected to said body 14 to thereby fully seal the same. It has been found most advantageous to construct the cavity resonator 35 from a material having high magnetic permeability in low magnetic fields. It can be seen that the cavity resonator 35 is closed to the outer air and thus may, when connected to a heater ring 18, be advantageously controlled to maintain by heat control means 22 a constant temperature, e.g. 75° C. In one embodiment, the material of the cavity resonator 35 may comprise a nickel-steel alloy containing about 17 to about 20 percent iron, about 5 percent copper and low percentages of manganese or chromium. In general, however, any of a host of ferromagnetic compositions or materials capable of rendering equivalent magnetic-permeable properties such as metals or alloys of high magnetic permeability may serve as the resonant cavity 35 as long as such permeability is at least equal to if not significantly greater than that of pure iron with or without additional constituents, such as cobalt and chromium. Such metals, as known, provide effective shielding from the earth's magnetic field and from any other magnetic field or fields which might cause interference in order to achieve the desired precise control of the resonant frequency of operation.

In conventional atomic frequency standards, the resonator cavity 35 is generally silver plated, or copper flashed at first and thereafter silver plated. Thus, the light reaching the photodetector also includes light reflecting from the interior walls of the resonator cavity 35.

A current supplied to the windings 19 cause a magnetic field known as a "C-field" to be established. A number of C-field windings 19 are made around the inside wall of the microwave cavity resonator and, hence, around the absorption cell 25. Thus, the windings 19 are disposed inside the cavity resonator 35 for producing, by means of a C-field power and controller 23, a dc magnetic field of a predetermined intensity. Generally, this could vary over a wide range but is usually between about 0 to about 1 gauss. Although any number of wound sections may be used, two separately energizable sections may be readily utilized as shown, 19*a* and 19*b*. One of the functions of the C-field windings 19 is to create in operation a magnetic bias field in the microwave cavity resonator 35 and, therefore, within the absorption cell 25. The coils 19*a* and 19*b* may be wound around the outside of the absorption cell 25 and any separation or space 32 between the absorption cell 25 and said cavity resonator 35 may be readily filled with a non-magnetic polymer material such as polymeric silicone elastomers including room temperature-vulcanizing silicone rubber compounds, organosiloxane polymers and the like. Generally, the windings 19 consist of a single layer of turns of insulated copper wire. The C-field windings 19 are placed in an appropriate position to create typically a predetermined magnetic field not exceeding approximately one gauss to bias magnetically the absorption cell 25 and thereby to separate the Zeeman levels of each hyperfine state of the vapor atoms. Connected through the wall of lid 15 is a microwave input means comprising a feed-through capacitor 13 coupled to a step recovery diode 20 by means of a conductor 33. By such input means microwave energy is rendered to the interior of the cavity resonator 35 to provide microwave coupling thereto.

As previously discussed, the microwave cavity resonator 35 is excited with microwave energy at the atomic resonance frequency of the atomic vapor within the absorption cell 25 and in the case of rubidium at a frequency of 6.834 . . . GHz. In practice, this signal is derived from the 10 MHz VCXO 27 by means of a frequency synthesizer 21 and modulation generator 29. Thus, the microwave energy applied to the cavity resonator 35 is frequency modulated at a low modulation frequency, generally about 150 hertz. The output of the synthesizer 21, which is generally about 60 MHz plus an additional signal of 5.3125 MHz is applied to a microwave generating means including the feed-through capacitor 13, the step recovery diode 20 and the length of the conductor 33. As is known, the step recovery diode 20 functions as a harmonic generator and mixer producing an output signal that contains multiple harmonics of the input signal, the one hundred fourteenth harmonic of the input 60 MHz frequency being 6.84 GHz. Additionally, the diode 20 functions as a mixer to provide microwave energy at a frequency of 6834.6875 MHz (6840.0000 MHz–5.3125 MHz), the frequency of Rb87 in one preferred embodiment. As already discussed, the injection of electromagnetic energy at this frequency interacts with the rubidium absorption cell 25 to produce a detectable partial reversal of the optical pumping process.

An error signal is generated to control VCXO 27 by the following scheme. The ac signal from the photodetector 16 is coupled to an amplifier located in control means 26 and the amplified signal is applied to a synchronous demodulator in control means 26 which also receives a signal from a modulation generator 29. By this means it can be determined if the carrier frequency of the signal applied to the cavity resonator 35 is properly centered on the frequency of the hyperfine transition 6.834 . . . GHz. Any deviation or displacement results in an error signal at the output of the demodulator of control means 26. This signal is used to control the VCXO 27 which may be modified so as to maintain the frequency of the synthesized microwave signal at 6.834 . . . GHz centered on the frequency of the hyperfine transition of rubidium.

The above discussion relates to a conventional physics package 10. Thus, such a physics package 10 described is subject to the same light intensity decay problem experienced by all conventional physics packages.

The inventors have discovered that the decay of light intensity is caused primarily by the decreasing reflectivity of such light reflecting surfaces as the coils of wire in exciter coil 17, the light reflective portions of lamp housing 12, the edges 35*b* of microwave cavity resonator 35 that are adjacent the dielectric window 30, and the interior surfaces 35*a* of the microwave cavity resonator 35. Some of these surfaces are silver or silver plate and it has been determined that the time dependent tarnishing and oxidation of such silver surfaces is a principal cause of the time decay of light intensity at the absorption cell 25. Such loss of bright intensity decreases the sensitivity and frequency discrimination ability of physics package 10, as described above.

However, improvements according to the present invention, if made to a conventional physics package, will dramatically reduce the decay in light intensity and thereby improve the long term stability of the associated frequency standard, magnetometer, or the like.

For example, the reflective surfaces of the physics package, such as the surfaces of the exciter coil 17 surrounding the discharge lamp, can be coated (tarnished) with silver sulfide ($Ag_2S$).

Typically, the exciter coil 17 is made from silver, and is therefore subject to tarnish in the normal course of events due to exposure to atmosphere, and possible outgassing of adhesives, etc. in the standard, particularly as it operates at elevated temperature. The optical constants for tarnish on silver have been measured and can be used to compute the light reflectivity for silver wire as a function of tarnish. The calculation shows that the reflected light decreases rapidly at first and then levels off for tarnish thickness above some threshold value. Thus, for a layer of tarnish thicker than the threshold value, there should be no further light decay due to the tarnished wire, even if the tarnish layer increases while the lamp is operating in a unit. Moreover, the pre-tarnish layer does not have to be precisely controlled—only made greater than the threshold level.

Figure 3:
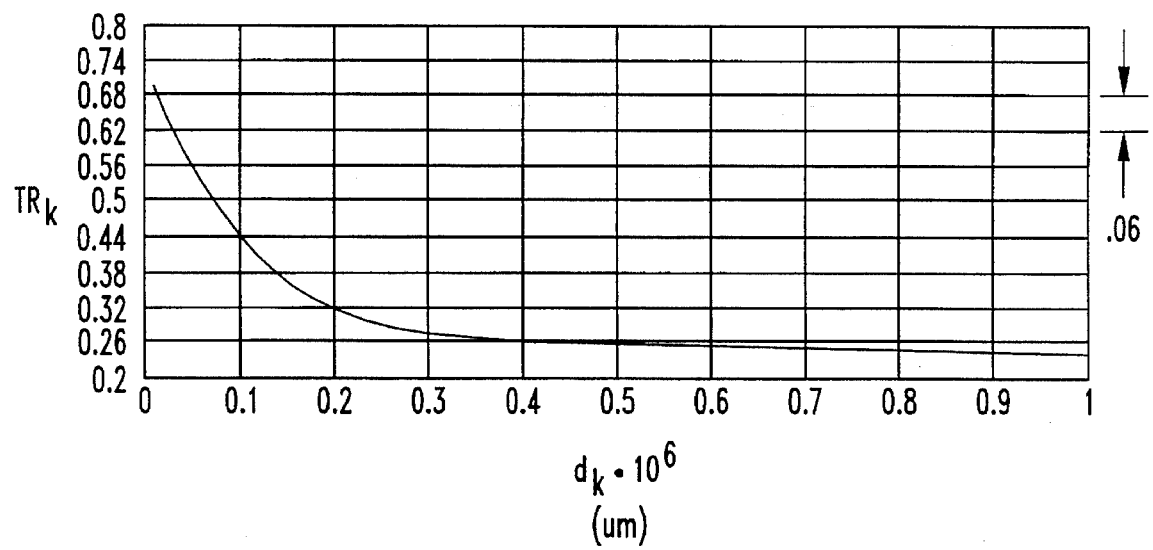
FIG. 3 is a graph of reflectance versus coating thickness of $Ag_2S$.

As shown in FIG. 3, a 0.4 μm (micron) $Ag_2S$ coating formed on a silver substrate results in a reflectance that remains essentially constant at about 0.25. Any additional tarnish that forms on the reflective surface beyond the 0.4 μm coating will not produce any significant decrease in the reflectivity. Thus, by initially coating the reflective surfaces with at least a 0.4 μm coating of $Ag_2S$, the physics package can be artificially "aged", and thereafter experience only insubstantial light intensity decay.

Another advantage of using tarnish is that it forms a coating on the silver wire that is stable over long periods of time (many years) at the elevated operating temperatures of the lamp coil. This is inferred from the observation that tarnish forms naturally on initially untarnished coils during normal operation, and field experience shows that it is stable (indefinitely). Other coatings, such as paint, epoxies and materials requiring organic binders, may peel, flake or undergo other types of undesirable physical or chemical transformation at the required operating temperatures in the presence of rf energy. Such behavior is hard to predict in advance because of the requirement of stability over long time periods of many years.

Yet another advantage of using tarnish on the silver lamp coil is that it preserves the ignition properties of the lamp coil. From the perspective of rapid lamp ignition, silver is an ideal material for the lamp coil wire because of its extremely lower rf surface resistivity (which, in turn, is due to its very small skin depth at rf frequencies). Plating silver with even a very thin layer of some other metal (e.g., tin or nickel) can seriously degrade the ignition properties of a lamp coil. When tarnish is used on a silver coil the ignition properties characteristic of untarnished silver appear to be retained. This is reasonable because tarnish, being a semiconductor, should be invisible to rf fields when the coating is very thin.

One method of pre-tarnishing silver that works well is to use a large container, such as a glass beaker, with powdered sulfur in the bottom. Components with light reflective silver surfaces, such as lamp exciter coils wound into coil forms with solid silver wire (or the silver wire from which such coils are wound) the lamp housing 12, and the cavity resonator 35, can be placed inside the container on top of a stainless steel screen. The container can then be closed, and heated, for example, by placing it on a hot plate. When the heated container is left on the hot plate for four or more hours (overnight works well), the silver surfaces turn black which is the color of $Ag_2S$.

Two lamp exciter coils were pre-tarnished in this way and tested. The tests were carried out using four rubidium frequency standard units that had been operating for a total of about five months. These were units that originally had very high light voltage decay rates, i.e., >10% per month. At the end of the five months, the original lamp coils of these units were removed and two were replaced with pre-tarnished lamp coils, one with light tarnish, and one with heavy tarnish. The other two were replaced with new, untarnished (shiny) lamp coils. The four units were then placed back in test and the light voltage recorded for 50 days. The light voltage decay rate for the untarnished coils averaged 2.6 percent per month. The average decay rate for the pre-tarnished coils was 0.54 percent per month, a significant improvement. A second set of similar experiments were carried out for about one month right after the first set. In these experiments, the light voltage decay rate for the untarnished coils averaged 5.1 percent per month. The average decay rate for the pretarnished coils was 1.1 percent per month, again a significant improvement.

Of course, the tarnish layer reduces the light incident on the photodetector. However, this effect can be offset by other means, such as an increase in the amplification of the photocurrent or an increase in the lamp operating temperature. With appropriate compensation to minimize the effect of the reduced reflectance, the improved physics package will provide a stable light intensity over a long period of time and thereby maintain the integrity of the standard or magnetometer. Thus, the present invention provides a greatly improved physics package by dramatically reducing the light intensity decay.

Of course, it will be appreciated that passivation methods can be applied to other metals that are sometimes used, such as copper or aluminum. Moreover, pre-tarnishing the metals is not the only way of passivating the metals. For example, the reflective surfaces can be covered with a material that is non-reflective, or a coating whose reflectivity does not change with time, or a transparent coating that prevents tarnishing or oxidation. In addition, light reflective surfaces of the physics package can be plated with a metal that does not tarnish or oxidize, such as gold. "Chrome" may also be used where its magnetic properties will not interfere with operation of the physics package.

In a preferred embodiment, silver wire is plated with gold. Gold-plated silver wire has been found to have excellent lamp ignition properties, almost as good as unplated silver wire. This can be attributed to the fact that the ac surface resistivity of gold is only 16 percent greater than that of silver. Use of gold plating suffers from the disadvantage that the silver "base" metal can diffuse through the gold plating over a period of time and then possibly tarnish on the surface. However, the inventors have discovered that the majority of tarnishing occurs early on in the life of the device and then slows down. Thus, the tarnishing is believed to be caused by some transient phenomenon, possibly the outgassing of materials used in the construction of the physics package. Therefore, the gold plating only has to protect the surface until the transient phenomenon is over, at which time diffusion of the silver through the gold plating will have little effect since the tarnishing agent in the atmosphere will have been depleted.

Figure 4:
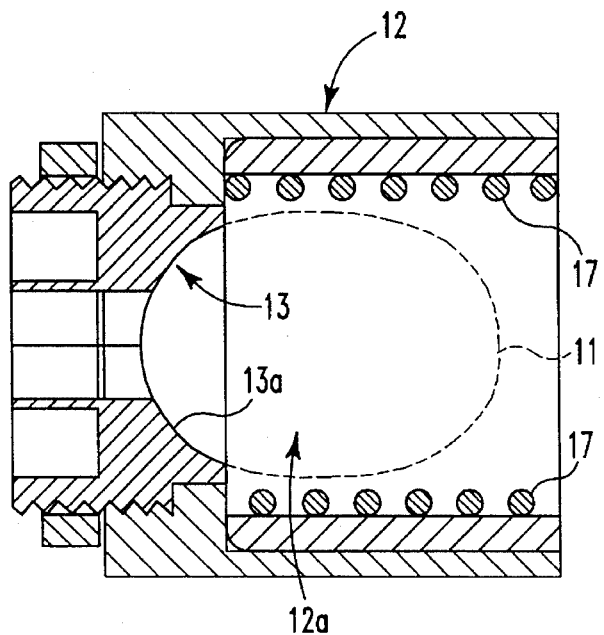
FIG. 4 shows a lamp housing with a lamp holder and exciter coil.

A preferred embodiment, shown in FIG. 4, includes a lamp housing 12 having an interior cavity 12a for receiving a gas lamp bulb 11, a lamp holder 13, and an exciter coil 17. The lamp holder 13 includes a generally hemispherical or parabolic lamp receiving surface 13a configured to mate with a lamp bulb 11. Preferably both the exciter coil 17 and the lamp receiving surface 13a are gold-plated so as to maximize the amount of reflective surface in the interior cavity 12a.

Additionally, the reflective surfaces of the cavity resonator 35 (FIG. 2) can be gold-plated. The reflective surfaces can include the interior surface 35a and the edges 35b of the cavity resonator 35 that are adjacent the dielectric window 30.

Although the invention has been described in detail with reference to a certain preferred embodiment, variations and modifications exist within the scope and spirit of the invention as described and defined in the following claims.

We claim:

1. In a method of providing optically-pumped atoms with incident light, the improvement comprising reducing the decay, over time, of the intensity of said incident light by passivating exciter coil surfaces from which said incident light is reflected.

2. The method of claim 1 wherein the surface comprises silver.

3. The method of claim 1 wherein the surface comprises copper.

4. The method of claim 1 wherein the surface comprises aluminum.

5. The method of claim 1 wherein the surface is metallic and comprises sulfur-containing derivatives of the base metal.

6. The method of claim 1 wherein the surface comprises silver sulfide.

7. The method of claim 1 wherein the surface is metallic and comprises metallic oxides.

8. The method of claim 1 wherein the surface comprises mu-metal.

9. The method of claim 1 wherein the surface is metallic and is passivated by a gold plating.

10. The method of claim 2 wherein the silver surfaces are passivated by forming silver sulfide thereon.

11. The method of claim 10 wherein said silver surfaces are placed in a closed container and exposed to sulfurous gas.

12. A method of substantially reducing the rate of decay of light intensity over a period of time in an optical pumping device having a lamp, a detector, and an absorption cell disposed therebetween, said method comprising: forming a passivated layer on a surface from which light between the lamp and detector can be reflected toward the absorption cell and said detector.

13. A method as recited in claim 12 wherein a magnetometer comprises said optical pumping device.

14. A method as recited in claim 12 wherein an atomic frequency standard comprises said optical pumping device.

15. A method as recited in claim 12 wherein the optical pumping device includes a lamp coil formed with silver wire, and said passivated layer is formed with a silver sulfide layer.

16. A method as recited in claim 12 wherein said surfaces are metallic, and said passivated layer comprises gold.

17. A method as recited in claim 12 wherein the optical device includes a light-reflecting lamp coil formed from metallic wire, and said passivated layer is formed on said metallic wire.

18. A method for reducing light intensity decay in an atomic frequency standard wherein an ensemble of atoms is optically pumped and interrogated by a microwave signal so as to produce a photocurrent which is used to control the frequency of the microwave signal, the method comprising the steps of:

providing a plasma discharge lamp for optically pumping the ensemble of atoms, and passivating surfaces that reflect light from the lamp toward the ensemble of atoms.

19. The method of claim 18 wherein the passivating step includes the step of providing said surfaces with a non-reflective layer.

20. The method of claim 18 wherein the passivating step includes the step of providing said surfaces with a layer whose reflectivity remains substantially constant over time.

21. The method of claim 18 wherein the passivating step includes the step of altering said surfaces so that change in reflectivity, over time, is minimized.

22. The method of claim 18 further including the steps of providing a lamp housing for said plasma discharge lamp with a cavity defined by interior surfaces, the cavity being adapted to receive the lamp, and passivating the interior surfaces of the cavity.

23. In a frequency standard comprising a light source, an absorption cell, and a photodetector, wherein light emissions from the light source are transmitted toward the absorption cell and detected by the photodetector, the improvement comprising:

an exciter coil positioned to excite the light source to stimulate the light emissions, the exciter coil including a surface that reflects a portion of the light emissions toward the absorption cell and photodetector, wherein the reflective surface is passivated to reduce decay of the intensity, over time, of the light available at the photodetector.

24. The Improvement of claim 23 wherein the exciter coil comprises silver wire and the surface of silver wire is passivated with silver sulfide.

25. The improvement of claim 23 wherein the exciter coil comprises copper and the copper is passivated with copper sulfide or copper sulfate.

26. The improvement of claim 23 wherein the exciter coil comprises silver wire and the surface of the silver wire comprises gold plate.

27. The improvement of claim 26 wherein the gold plate is applied directly to the silver wire in a thickness of about 0.001 inch.

28. The improvement of claim 23 wherein the exciter coil comprises copper wire and the surface of the copper wire comprises gold plate.

29. The Improvement of claim 28 wherein the gold plate is applied directly to the copper wire.

30. In a frequency standard comprising a physics package comprising a light source, a reflective surface, an absorption cell, and a photodetector, reflecting light from said light cell to said absorption cell, the improvement comprising providing said reflective surface of said physics package with a layer whose light reflectivity does not change substantially with time.

31. The improvement of claim 30 wherein said layer comprises gold plate.

32. The improvement of claim 30 wherein said layer comprises silver sulfide.

33. In a frequency standard wherein the physics package includes a lamp package including a gas lamp, a lamp holder and an exciter coil, an absorption cell and a photodetector for detecting the intensity of light from said lamp passing through said absorption cell, the improvement wherein the lamp holder comprises a passivated light reflective surface directing light from said gas lamp through said absorption cell.

34. The improvement of claim 33 wherein said passivated light reflective surface of said lamp holder comprises gold.

35. The improvement of claim 33 wherein said lamp holder is formed from nickel-plated aluminum and said passivated light reflective surface comprises a gold plate applied to the surface of the lamp holder adjacent the gas lamp.

36. The improvement of claim 35 wherein the exciter coil surrounds the gas lamp and comprises a passivated light reflective surface.

37. The improvement of claim 36 wherein said passivated light reflective surface of the exciter coil comprises gold.

38. The improvement of claim 37 wherein said exciter coil comprises silver wire with a gold plate surface greater than 0.0001 inches thick.

39. The improvement of claim 36 wherein said passivated light reflective surface of said lamp holder and passivated light reflective surface of said exciter coil form a light directing cavity around the gas lamp.

* * * * *